United States Patent
Kao et al.

(10) Patent No.: US 7,557,540 B2
(45) Date of Patent: Jul. 7, 2009

(54) CAPACITY MEASUREMENT SYSTEM FOR A BATTERY WITH OPEN CIRCUIT VOLTAGE DETECTION

(75) Inventors: William Kao, Taipei (TW); Vincent Hou, ShangHai (CN); Liusheng Liu, San Jose, CA (US)

(73) Assignee: O2Micro International Ltd., Georgetown (KY)

( * ) Notice: Subject to any disclaimer, the term of this patent is extended or adjusted under 35 U.S.C. 154(b) by 127 days.

(21) Appl. No.: 11/453,606

(22) Filed: Jun. 15, 2006

(65) Prior Publication Data

US 2007/0170893 A1 Jul. 26, 2007

Related U.S. Application Data

(60) Provisional application No. 60/761,286, filed on Jan. 23, 2006.

(51) Int. Cl.
*H02J 7/00* (2006.01)
(52) U.S. Cl. .................. 320/132; 320/134; 320/136; 324/427
(58) Field of Classification Search ................ 320/134, 320/136; 324/427
See application file for complete search history.

(56) References Cited

U.S. PATENT DOCUMENTS

| | | | | |
|---|---|---|---|---|
| 4,387,334 A * | 6/1983 | Loper | ........................ | 320/136 |
| 4,910,682 A * | 3/1990 | Wolff et al. | .................. | 702/46 |
| 5,701,068 A * | 12/1997 | Baer et al. | ................. | 320/119 |
| 6,469,403 B2 * | 10/2002 | Omata et al. | .............. | 290/40 C |
| 6,737,831 B2 * | 5/2004 | Champlin | ................... | 320/132 |
| 7,107,160 B2 * | 9/2006 | Bean | .......................... | 702/63 |
| 7,363,000 B2 * | 4/2008 | Fishman et al. | ............ | 455/3.04 |
| 2002/0157882 A1* | 10/2002 | Kubo et al. | ................ | 180/65.3 |
| 2005/0068039 A1* | 3/2005 | Bertness | ...................... | 324/426 |
| 2007/0120536 A1* | 5/2007 | Runkle et al. | .............. | 320/136 |

\* cited by examiner

*Primary Examiner*—Akm E Ullah
*Assistant Examiner*—Arun Williams
(74) *Attorney, Agent, or Firm*—Wang Law Firm, Inc.; Li K. Wang

(57) ABSTRACT

A method and system for measuring the remaining capacity of a battery with open circuit voltage detection is disclosed. The method includes the steps of measuring an open circuit voltage, obtaining an initial capacity based on the open circuit voltage, initializing an accumulation counter with the initial capacity, adjusting the accumulation counter, and obtaining the remaining capacity based on the accumulation counter. The method further includes the step of calibrating the accumulation counter to eliminate accumulated error and offset resulting from the previous operation of adjusting the accumulation counter.

16 Claims, 3 Drawing Sheets

CAPACITY MEASUREMENT SYSTEM FOR A BATTERY WITH OPEN CIRCUIT VOLTAGE DETECTION

RELATED APPLICATION

This application claims the benefit of U.S. Provisional Application No. 60/761,286, Approach For Evaluating The Battery Remaining Capacity, filed on Jan. 23, 2006, the specification of which is hereby incorporated in its entirety by reference.

BACKGROUND OF THE INVENTION

1. Field of the Invention

The present invention relates to power management for electronic devices, and more particularly to measuring battery capacity.

2. Description of the Related Art

Currently, to meet users' various demands, more and more functionalities are integrated into portable devices. However, the power source has quickly become a bottleneck to such functionality expansion. One concern is that improvement of battery power density cannot keep up with the demands, and another concern is that the dynamic load profile makes tracking battery status a complex task. Usually, depletion of the battery power without timely alert can lead to unpleasant results, and to preclude the unpleasant results, it is desirable for users to be informed of the battery status. Now, more and more circuit designers are casting their eyes on battery monitor apparatuses, fox example, battery gas gauge, to improve capacity measurement and prediction of battery run-time.

One gas gauge approach is to use voltage measurement for battery capacity reports, since batteries always exhibit certain voltage versus capacity characteristics. Although simple and low in hardware cost, the voltage-based scheme compromises the accuracy by failing to account for the elusive battery impedance. Therefore, the voltage measurement is always affected by battery impedance effect, which can make the voltage measurement invalid for capacity prediction.

An alternative to the voltage-based scheme is to count coulomb charge passing in and out of batteries via an accumulation counter in addition to the voltage measurement. Coulomb charge, computed by integrating battery current over time, is a representation of battery capacity. The gas gauges based on coulomb charge counting and voltage measurement schemes have two types, with and without a CPU. The gas gauge with a CPU provides a stand-alone solution for battery capacity reports. All measurement and computation are accomplished by the battery gas gauge, and key battery parameters, such as remaining capacity and relative state of charge, are directly accessible by the host through the communication port. The gas gauge without a CPU, known as a battery monitor, provides coulomb data to the host along with battery voltage and temperature readings. The host develops a gas gauge code to process the data and compute the remaining capacity of the battery. Unfortunately, the gas gauge code is unfamiliar to engineers specializing in software development at the host end, and it is usually a complicated task to compute the remaining capacity of the battery at the host. Further, though the gas gauge with the CPU can directly provide the host with the remaining capacity of the battery, the financial cost of this approach is higher.

Regardless whether equipped with a CPU, one concern with the coulomb counting approach is that the initial capacity is estimated using the simple voltage-based measurement which induces inaccuracy at the beginning of the coulomb counting. Another concern with the coulomb counting approach is that during the dynamic monitor stage, accumulated error and offset will inevitably occur and result in inaccuracy for a long term monitoring. Therefore, it is desirable to have a system and method which can enhance the measurement accuracy without additional circuitries and it is to such a system and method the present invention is primary directed.

SUMMARY OF THE INVENTION

In one embodiment, there is provided a method for measuring remaining capacity in a battery. The method includes the steps of a) measuring an open circuit voltage, b) obtaining a capacity of the battery based on the open circuit voltage, c) storing the capacity of the battery in an accumulation counter, d) adjusting the accumulation counter according to a discharging or charging process of the battery, and e) obtaining the remaining capacity of the battery based on the accumulation counter.

In another embodiment, there is provided a system for measuring the remaining capacity of a battery. The exemplary system includes a battery having an open circuit voltage, a battery monitor for monitoring the battery and measuring the open circuit voltage, and a host device for reading the battery monitor and indicating the remaining capacity of the battery. The battery monitor includes an accumulation counter, and the host device is capable of initializing the accumulation counter with an initial capacity and calibrating the accumulation counter with a calibrating capacity.

In yet another embodiment, there is provided an electronic device capable of displaying remaining capacity of a battery. The electronic device includes a power terminal for receiving electrical power from the battery, a battery monitor connected to the battery for detecting battery parameters, a microprocessor for computing the remaining capacity of the battery based on the battery parameters and capacity status of the battery obtained from the battery monitor, and a display screen for displaying the remaining capacity of the battery. The battery monitor further includes an accumulation counter for indicating the capacity status of the battery, and the battery parameters include open circuit voltage for initializing and calibrating the accumulation counter,

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION OF THE INVENTION

Reference will now be made in detail to embodiments of the present invention. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
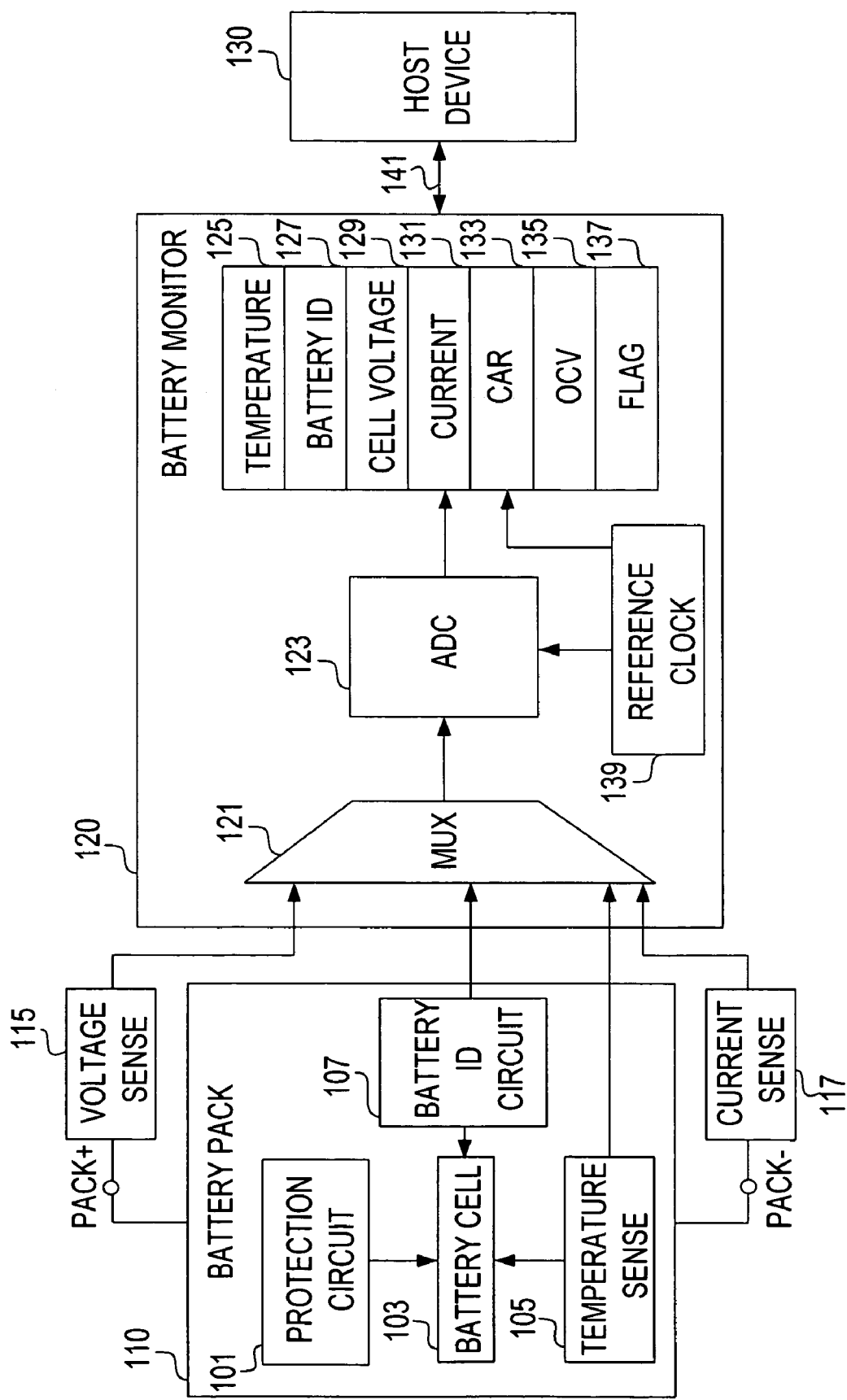
FIG. 1 is an exemplary system for measuring remaining capacity of a battery in accordance with one embodiment of the present invention.

FIG.1 illustrates an exemplary system 100 for measuring remaining capacity of a battery. The system 100 includes a battery pack 110, a battery monitor 120, and a host device 130. The system 100 further includes a voltage sense circuit 115 and a current sense circuit 117. The voltage sense circuit 115 and the current sense circuit 117 serve as peripheral circuits of the battery monitor 120. For package architecture, the battery monitor 120 with its peripheral circuits can be packed either within the battery pack 110 or placed in a host end along with the host device 130 as illustrated in FIG. 1.

The battery pack 110 is composed of a protection circuit 101, a battery cell 103, a temperature sense circuit 105 and a battery ID circuit 107. The battery pack 110 further has a positive terminal PACK+ and a negative terminal PACK− that respectively have the highest potential and the lowest potential of the battery pack 110. The battery cell 103 serves as a system power source whose remaining capacity increases during a charging process and decreases during a discharge process. The battery cell 103 may be any commercially available battery, for example, a Lithium-Ion battery. The protection circuit 101 is connected to the battery cell 103 for protecting it from over charge, over discharge and over current. In order to evaluate the remaining capacity of the battery cell 103, several battery parameters, such as open circuit voltage of the battery cell 103, battery type, battery voltage, battery current and battery temperature, should be detected. Particularly, characteristics of the open circuit voltage are that the open circuit voltage is correlative to the battery capacity and the relationship between the open circuit voltage and the battery capacity hardly changes with battery temperature, battery aging, and cell-to-cell variations. Therefore, the open circuit voltage of the battery cell 103 is an ideal indication for the remaining capacity of the battery. However, since it is hard to obtain the open circuit voltage in a dynamic load environment, the open circuit voltage is only used to represent the remaining capacity of the battery before the system 100 is powered on and after the system 100 is powered off. Therefore, in the dynamic load environment, other battery parameters, such as the battery temperature, the battery voltage and the battery current, should be detected to acquire the remaining capacity of the battery.

The open circuit voltage is detected by the voltage sense circuit 115. The battery temperature is detected by the temperature sense circuit 105, which is packed within the battery pack 110. The battery type is detected by the battery ID circuit 107 in the battery pack 110. The battery current is detected by the current sense circuit 117 and the battery voltage is also detected by the voltage sense circuit 115. The battery monitor 120 can automatically identify the voltage detected by the voltage sense circuit 115 to be the open circuit voltage or the battery voltage. For example, the battery monitor 120 regards the detected voltage as the open circuit voltage if the voltage is detected before the system 100 is powered on or after the system is power off for a predetermined period, otherwise, the battery monitor 120 regards the detected voltage as the battery voltage. These battery parameters are provided to the battery monitor 120.

The battery monitor 120 is composed of a multiplexer (MUX) 121, an analog to digital converter (ADC) 123, a plurality of registers and a reference clock 139. The multiplexer 121 receives the battery parameters and sequentially selects and passes them to the ADC 123. The ADC 123 is a multi-channel converter for digitizing the received battery parameters. The digitized battery parameters are stored in the plurality of registers. The plurality of registers includes a temperature register 125 used for storing the battery temperature, a battery ID register 127 for storing the battery type, a cell voltage register 129 for storing the battery voltage, and a current register 131 for storing the battery current. The plurality of registers also includes some special registers such as a current accumulation register 133, an open circuit voltage register 135, and a flag registers 137. The current accumulation register (CAR) 133 serves as an accumulation counter to indicate a dynamic remaining capacity of the battery. The open circuit voltage (OCV) register 135 stores the open circuit voltage of the battery. The flag register 137 is used to indicate whether the OCV is detected and which condition triggers the OCV detection. For example, a first flag POOCV in the flag register 137 indicates that the OCV is detected before the system is powered on, and a second flag SLEEP-OCV in the flag register 137 indicates that the OCV is detected after the system is power off for a predetermined period. However, it should be understood by the skilled in the art that indication of the OCV detection can be realized by other conventional approaches, for example, indicating the OCV detection with a bit of the OCV register 135. The reference clock 139 generates time clock signals and provides accurate timing reference for operation of the ADC 123 and the plurality of registers using these time clock signals.

The battery monitor 120 operates in three modes, a start-up mode, a full power mode and a sleep mode. In the start-up mode, the battery pack 110 is initially attached to the battery monitor 120 and the battery monitor 120 automatically executes voltage calibration, temperature detection, battery type detection and OCV detection when powering up. The battery type detection is conducted only once. In other words, during the following operation cycle of the system, the originally detected battery type is steadily stored in the battery ID register 127 for future usage. Compared with the battery type, the battery voltage, the battery current and the battery temperature are measured and updated dynamically when the battery monitor 120 is operating in the full power mode. The CAR register 133 is also updated whenever the battery current is measured. After the battery current is measured, an internally accumulated action will be taken automatically which computes the coulomb charge by integrating the measured battery current value over time. Based on the coulomb charge, the CAR register 133 is updated. In the sleep mode, the OCV detection is also automatically executed on a certain condition, for example, when the battery monitor is in the sleep mode for a predetermined period.

The host device 130 can access the plurality of registers through communicating with the battery monitor 120 via SMbus 141. The SMbus 141 may adopt various protocols to realize communication between the host device 130 and the battery monitor 120, for example, an I2C protocol. Based on these battery monitor readings, the host device 130 calculates and calibrates the remaining capacity of the battery pack. Specifically, when the host device 130 acknowledges that the OCV detection occurs in the start-up mode after reading the flag register 137 and acquiring the first flag POOCV, the host device 130 will initialize the CAR register 133 with an initial capacity obtained from a look up table according to the battery type and OCV readings. Similarly, if the host device 130 acknowledges that the OCV detection occurs in the sleep mode after reading the flag register 137 and acquiring the second flag SLEEPOCV, the host device 130 will calibrate and rewrite the CAR register 133 with a calibrating capacity obtained from the look up table according to the battery type and OCV readings. Due to the characteristics of the open circuit voltage as previously stated, the CAR initialization according to the OCV and battery type readings is more accurate than the traditional initialization based simply on the battery voltage. The CAR calibration under the full power mode, which is executed if the second flag SLEEPOCV is stored in the flag register 137 in the sleep mode, can eliminate the accumulated error and offset caused by the coulomb counting.

Figure 2:
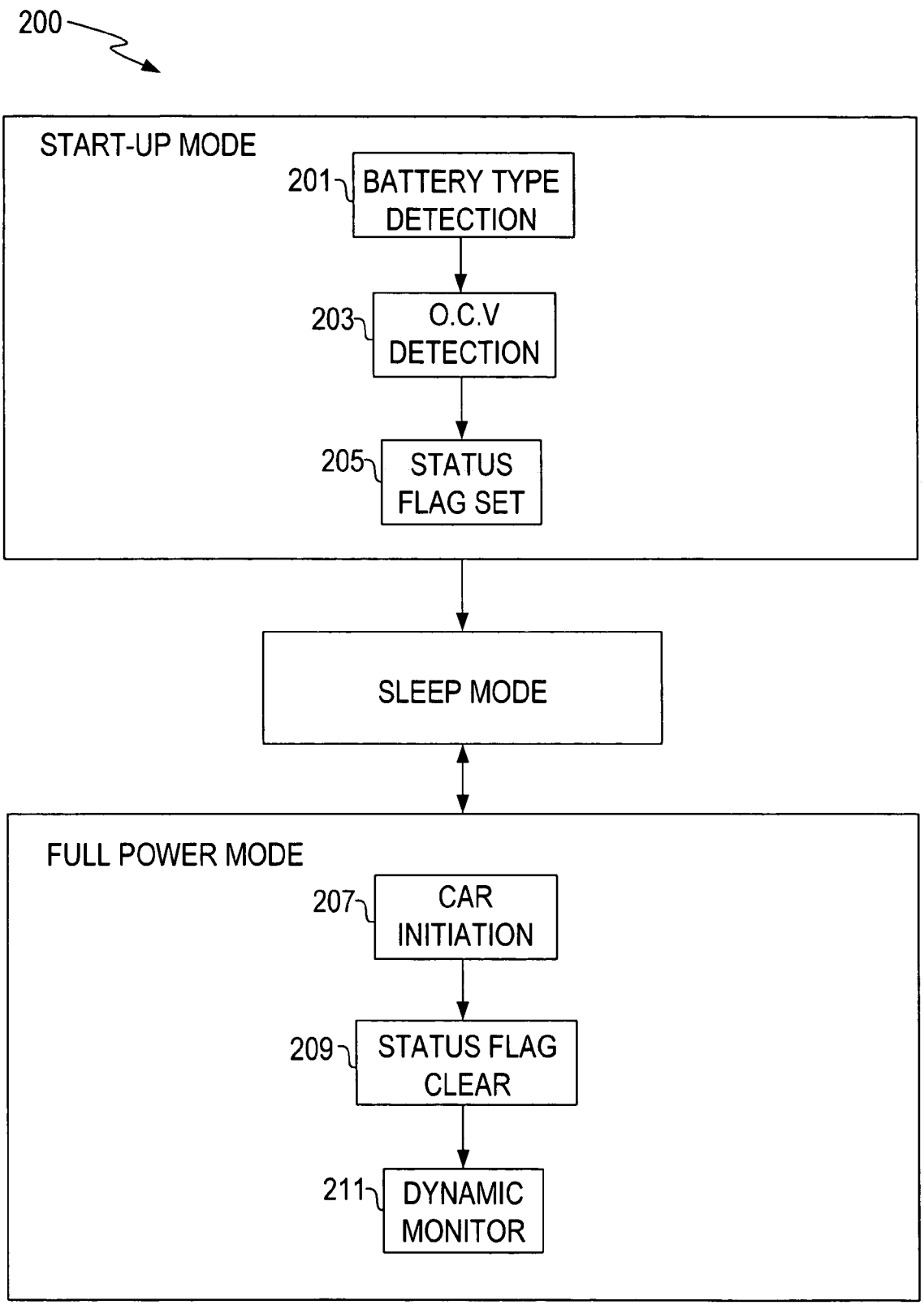
FIG. 2 is an operation flowchart of the exemplary system in FIG. 1.

FIG. 2 is a flowchart 200 illustrating operation of the exemplary system 100 in FIG. 1 when it is initially powered on. Herein, only steps significantly relevant to the present invention are illustrated for clarity. As stated previously, the battery monitor 120 can operate in three modes, the start-up mode, the sleep mode and the full power mode. The start-up mode starts when the battery monitor 120 is initially powered up by attaching the battery pack 110 to it. However, when the battery monitor 120 enters the start-up mode, the host device 130 is power off, that is, the system 100 is power off. In the start-up mode, the battery monitor 120 executes steps 201, 203 and 205 sequentially. In step 201, the battery type is detected, digitized and then stored in the battery ID register 137. In step 203, the open circuit voltage is detected, digitized and then stored in the OCV register 135. When the step 203 is completed, the first flag POOCV is written into the flag register 137 in step 205. Operations such as the voltage calibration and temperature detection are not shown. When the aforementioned steps are completed, the battery monitor shifts to the sleep mode. So far, the system is still power off. The battery monitor 120 will stay in the sleep mode until the host device 130 is powered on. When the host device 130 is powered on, the battery monitor 120 enters the full power mode for the first time. Further, it should be understood that if the host device 130 is powered on before or exactly when the battery monitor 120 completes operations in the stat-up mode, the battery monitor 120 will shift from the start-up mode to the full power mode directly.

In the full power mode, the host device 130 firstly initializes the CAR register 133 in step 207. In step 207, the host device 130 accesses the flag register 137 to learn whether the OCV detection has occurred. When reading out the first flag POOCV, the host device 130 will read the OCV register 135 and the battery ID register 127. According to the readings from the registers 127 and 135, the host device 130 searches in the look up table and obtains the initial capacity of the battery pack 110. Then, the host device 130 initializes the CAR register 133 with the initial capacity. After the host device 130 accesses the OCV register 135 in the CAR initialization step 207, the first flag POOCV in the flag register 137 is cleared in step 209. Finally, the battery monitor enters the dynamic monitor stage in step 211.

In the dynamic monitor stage, the battery monitor 120 scans the battery temperature, the battery voltage and the battery current continuously to update the registers 125, 129 and 131 respectively. The CAR register 133 is also updated dynamically based on the battery current flowing in and out the battery cell 103 respectively during the charging and discharging processes. These registers are accessible by the host device 130. The host device 130 utilizes the CAR reading to compute the remaining capacity, and utilizes the temperature and current readings to compensate the battery capacity. The battery monitor 120 will stay in the dynamic monitor stage until a mode shift is triggered.

Figure 3:
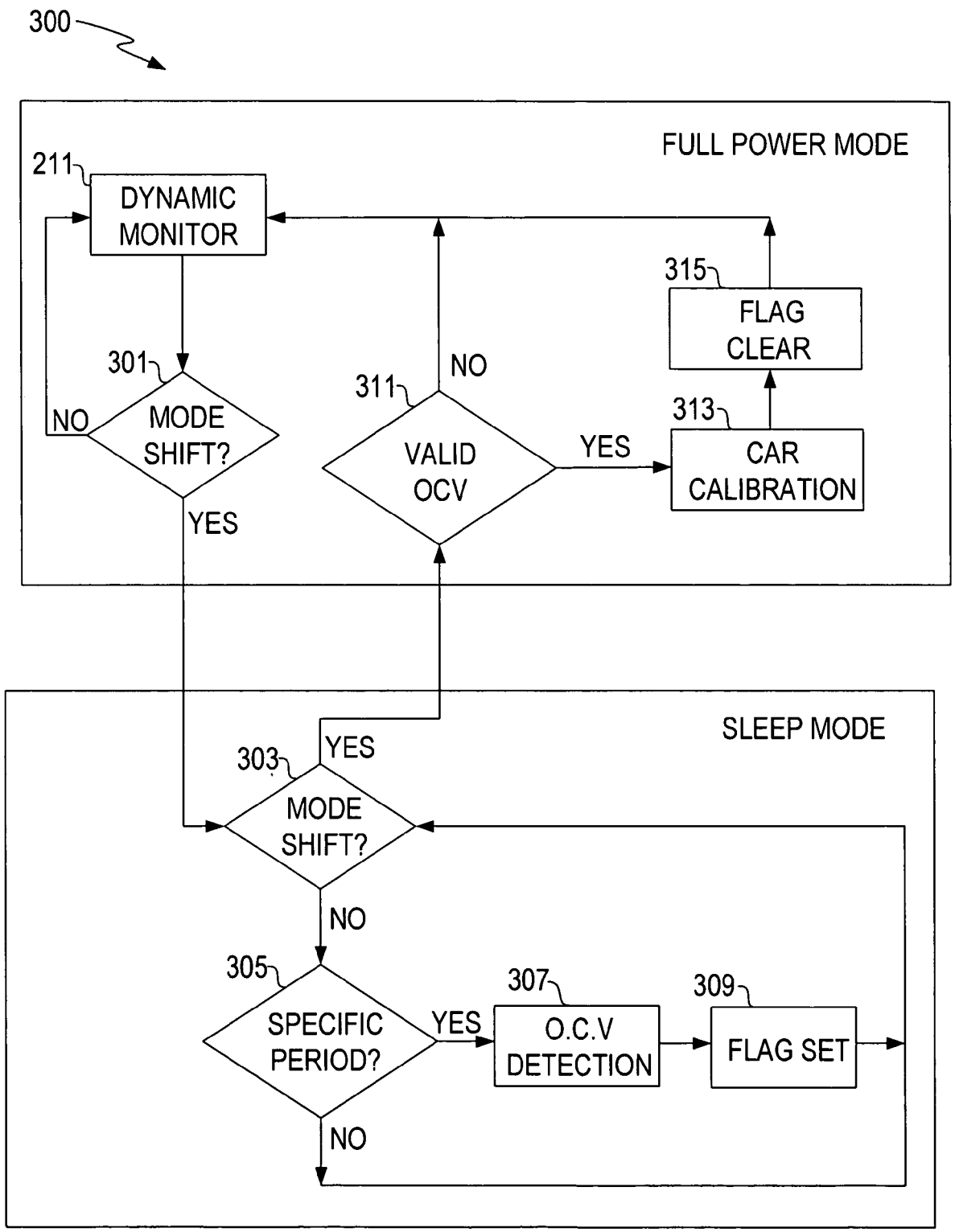
FIG. 3 is another operation flowchart of the exemplary system in FIG. 1.

FIG. 3 is another flowchart 300 illustrating normal operation of the exemplary system 100. As stated in FIG. 2, the battery monitor 120 may exit the dynamic monitor stage if there is a mode shift. The mode shift is triggered when the host device 130 is powered off. In step 301, the system determines whether the mode shift has been triggered. If the mode shift has not been triggered, i.e., the host device is still powered on, the battery monitor 120 continues the dynamic monitor in step 211. Otherwise, the battery monitor 120 will shift to the sleep mode when the host device 130 is powered off.

The battery monitor 120 will stay in the sleep mode until another mode shift is triggered. In the situation, the mode shift is triggered when the host device 130 is powered on. In step 303, the system determines whether the mode shift has been triggered. If the mode shift has not been triggered, i.e., the host device 130 is still power off, the system further checks how long the battery monitor 120 has stayed in the sleep mode. The battery monitor 120 behaves differently with different durations in the sleep mode. In step 305, the battery monitor 120 determines whether a predetermined period has elapsed after it shifts to the sleep mode. The predetermined period, for example, 30 minutes, is determined and programmed by the host device 130 and is adjustable according to users' demands. If the duration of the sleep mode reaches the predetermined period, the battery monitor 120 detects and stores the open circuit voltage again in step 307. The second flag SLEEPOCV is also stored in the flag register 137 in step 309 to indicate the occurrence of the OCV detection in the sleep mode. After steps 307 and 309, the system returns to step 303 and determines in which mode the system 100 is operating. If the duration does not reach the predetermined period, the battery monitor 120 will return to step 303 directly.

If the mode shift is triggered when the host device 130 is powered on, the battery monitor will shift from the sleep mode to the full power mode. After entering the full power mode, the host device 130 firstly determines whether valid OCV detection has occurred in the sleep mode in step 311. This is determined through reading the flag register 137 and the OCV register 135. In step 311, if the second flag SLEEPOCV is read out from the flag register 137, the host device 130 will read the OCV register 135 and the battery ID register 127. According to the readings from the registers 127 and 135, the host device 130 searches in the look up table and obtains the calibrating capacity of the battery pack 110. Then, the host device 130 calibrates the CAR register 133 with the calibrating capacity. However, if the OCV reading is obviously invalid, for example, 0 volt, the battery monitor 120 will not search the calibrating capacity and calibrate the CAR register 137. In addition, after the host device 130 accesses the OCV register 135 in step 313, the second flag SLEEPOCV in the flag register 137 is cleared in step 315. Then, the battery monitor 120 enters the normal dynamic monitor stage in step 211. In step 311, if after the flag register 137 is read, it is found that the second flag SLEEPOCV is not present in the flag register 137, the steps 313 and 315 are not executed, and the battery monitor 120 enters the normal dynamic monitor stage 211 directly. Afterward, the battery monitor 120 will repeat the conversion between the full power mode and the sleep mode following the aforementioned steps until the battery power is depleted.

The gas gauge approach as aforementioned can be utilized in various electronic system. The electronic system may be a cell phone, a computer, and a personal digital assistant (PDA), media player 4 (MP4) or other electronic products. Herein, we take the cell phone as an example to illustrate how the remaining capacity of a battery is acquired and displayed. The cell phone includes a power terminal, a microprocessor, a display screen, memory and a battery monitor. The power terminal is connected to the battery for receiving electrical power. The battery monitor 120 is also connected to the battery pack 110 for detecting battery parameters. The battery monitor 120 further includes an accumulation counter that indicates capacity status of the battery dynamically. Among the battery parameters, open circuit voltage is specially detected by the battery monitor 120. Based on the detected open circuit voltage, a remaining battery capacity value is obtained from a look up table that is stored in the memory of the cell phone. Then, the obtained capacity value is used to initialize or calibrate the accumulation counter. The battery parameters and the capacity status indicated by the accumulation counter are then accessed by the microprocessor in Host Device 130 through the SMBus 141. The microprocessor uses such information to compute the remaining capacity of the battery. Finally, the remaining capacity of the battery is displayed on the display screen.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A method for measuring a remaining capacity of a battery, comprising the steps of:
    measuring an open circuit voltage;
    initializing an accumulation counter with an initial capacity;
    calibrating the accumulation counter with a calibrating capacity;
    obtaining the initial capacity and the calibrating capacity of the battery based on the open circuit voltage;
    setting a first flag indicating that a host device initializes the accumulation counter;
    adjusting the accumulation counter according to a discharging or charging process of the battery; and
    obtaining the remaining capacity of the battery based on the accumulation counter.

2. The method of claim 1, wherein the step of measuring the open circuit voltage being executed before the battery supplies power to a load.

3. The method of claim 2, wherein the measurement of the open circuit voltage being marked with the first flag.

4. The method of claim 1, wherein the step of measuring the open circuit voltage being executed at a predetermined time after the battery intermits power supply to a load.

5. The method of claim 4, wherein the measurement of the open circuit voltage being marked with a second flag.

6. The method of claim 1, wherein the capacity of the battery being obtained from a look up table.

7. A system for measuring remaining capacity in a battery, comprising:
    a battery having an open circuit voltage;
    a battery monitor for monitoring the battery and measuring the open circuit voltage, the battery monitor including an accumulation counter and the battery monitor setting a first flag; and
    a host device for reading the battery monitor and indicating the remaining capacity of the battery, the host device further being capable of initializing the accumulation counter with an initial capacity and calibrating the accumulation counter with a calibrating capacity,
    wherein the battery monitor setting the first flag to indicate that the host device has initialized the accumulation counter, the initial capacity and the calibrating capacity being obtained based on the open circuit voltage.

8. The system of claim 7, wherein the host device further comprising a look up table.

9. The system of claim 7, wherein the open circuit voltage being measured before the system is powered on.

10. The system of claim 9, wherein the battery monitor setting the first flag to mark the open circuit voltage measurement.

11. The system of claim 7, wherein the open circuit voltage being measured at a predetermined time after the system is powered off.

12. The system of claim 11, wherein the battery monitor setting a second flag to mark the open circuit voltage measurement.

13. The system of claim 12, wherein the second flag indicating that the host device may calibrate the accumulation counter.

14. An electronic device capable of displaying remaining capacity of a battery, comprising:
    a power terminal for receiving electrical power from the battery;
    a battery monitor connected to the battery for detecting battery parameters, the battery monitor further including an accumulation counter for indicating a capacity status of the the battery parameters including an open circuit voltage for initializing the accumulation counter with an initial capacity and calibrating the accumulation counter with a calibrating capacity, and the battery monitor setting a first flag indicating that a host device initializes the accumulation counter;
    a microprocessor for computing the remaining capacity of the battery based on the battery parameters and the capacity status of the battery obtained from the battery monitor; and
    a display screen for displaying the remaining capacity of the battery.

15. The electronic device of claim 14, wherein the accumulation counter is initialized based on the open circuit voltage that is detected before the battery supplies power to the electronic device.

16. The electronic device of claim 14, wherein the accumulation counter is calibrated based on the open circuit voltage that is detected at a predetermined time after the battery intermits power supply to the electronic device.

* * * * *